US011722143B2

(12) United States Patent
Zhao et al.

(10) Patent No.: US 11,722,143 B2
(45) Date of Patent: Aug. 8, 2023

(54) ADC APPARATUS AND CONTROL METHOD

(71) Applicant: Halo Microelectronics International, Campbell, CA (US)

(72) Inventors: Lijie Zhao, San Jose, CA (US); Kien Chan Vi, Palo Alto, CA (US); Hai Tao, Sunnyvale, CA (US)

(73) Assignee: Halo Microelectronics International, Campbell, CA (US)

( * ) Notice: Subject to any disclaimer, the term of this patent is extended or adjusted under 35 U.S.C. 154(b) by 103 days.

(21) Appl. No.: 17/644,589

(22) Filed: Dec. 16, 2021

(65) Prior Publication Data

US 2022/0247419 A1  Aug. 4, 2022

Related U.S. Application Data

(60) Provisional application No. 63/143,537, filed on Jan. 29, 2021.

(51) Int. Cl.
*H03M 1/06* (2006.01)
*H03M 1/20* (2006.01)
*H03M 1/46* (2006.01)
*H03M 1/40* (2006.01)

(52) U.S. Cl.
CPC ......... *H03M 1/0607* (2013.01); *H03M 1/201* (2013.01); *H03M 1/40* (2013.01); *H03M 1/46* (2013.01)

(58) Field of Classification Search
CPC ...... H03M 1/0607; H03M 1/201; H03M 1/46; H03M 1/40
USPC ......................... 341/118, 120, 131, 163, 172
See application file for complete search history.

(56) References Cited

U.S. PATENT DOCUMENTS 9,356,615 B1 * 5/2016 Ranjbar ............... H03M 1/1023
10,483,995 B1 * 11/2019 Lok ..................... H03M 1/1042

* cited by examiner

*Primary Examiner* — Khai M Nguyen
(74) *Attorney, Agent, or Firm* — Li Li; AP3 Law Firm PLLC (57) ABSTRACT

A method of converting an analog input signal to a digital output signal includes adding a digitally controlled offset voltage into a comparison stage of a successive approximation analog-to-digital converter circuit, wherein the digitally controlled offset voltage has a periodic pattern including at least $2^{(K+1)}$ steps, each of which has a value equal to an integer multiplying $2^{(-K)}$ of an analog voltage corresponding to a least significant bit (LSB) of an N-bit digital signal, operating the successive approximation analog-to-digital converter circuit to sequentially generate at least a $2^{(K+1)}$ number of N-bit digital signals based on the at least $2^{(K+1)}$ steps of the digitally controlled offset voltage, summing the at least the $2^{(K+1)}$ number of N-bit digital signals to obtain a summing result, and dividing the summing result through a divider block to obtain a digital signal having (N+K) bits.

20 Claims, 9 Drawing Sheets

Figure 9

ADC APPARATUS AND CONTROL METHOD

PRIORITY

This application claims the benefit of U.S. Provisional Application No. 63/143,537, filed on Jan. 29, 2021, entitled "ADC Apparatus and Control Method," which application is hereby incorporated herein by reference.

TECHNICAL FIELD

The present invention relates to an analog-to-digital converter (ADC), and, in particular embodiments, to a successive approximation ADC.

BACKGROUND

ADCs are commonly used in electronics systems to convert analog signals into digital signals. The digital signals may be further processed by various digital processors such as digital audio/video processors, wireless communication processors and the like. In some applications, ADCs may be implemented as standalone semiconductor devices. Alternatively, ADCs may be integrated with other circuitry on a single integrated circuit. Among various ADCs, the successive approximation ADC is widely used in a variety of applications requiring good resolution and accuracy.

The successive approximation ADC converts an analog signal to a digital signal by comparing various output values of a digital-to-analog converter (DAC) with the input analog signal over a number of clock cycles. For example, in a first conversion cycle, the most significant bit (MSB) of the digital signal is determined by comparing the input analog signal with the midscale output of the DAC (that is, an analog output corresponding to 100 . . . 00, where the MSB of the DAC is set to logic 1). If the value of the input analog signal is greater than the midscale output of the DAC, the MSB of the digital signal is set to a logical one. On the other hand, if the value of the input analog signal is less than the midscale output of the DAC, the MSB of the digital signal is set to a logical zero. In the second conversion cycle, the input analog signal is compared with the ¼ scale or ¾ scale output of the DAC depending on the outcome of the first conversion cycle. In the second conversion cycle, the second most significant bit is determined. The comparison method described above continues all the way down to the least significant bit (LSB) of the digital signal. Once the LSB has been determined, the analog-to-digital conversion is complete and the digital signal is available at a register of the successive approximation ADC.

A normal resolution successive approximation ADC (e.g., 10-bit resolution) is sufficient for most applications. However, a higher resolution successive approximation ADC (e.g., 11-bit or 12-bit resolution) may be desired in some applications. It is desirable to have a simple and reliable method to increase the resolution of the normal resolution successive approximation ADC so as to satisfy different application demands.

SUMMARY

These and other problems are generally solved or circumvented, and technical advantages are generally achieved, by preferred embodiments of the present disclosure which provide a higher resolution successive approximation ADC through adding a digitally controlled offset voltage into the comparison stage of the successive approximation ADC.

In accordance with an embodiment, a method of converting an analog input signal to a digital output signal comprises adding a digitally controlled offset voltage into a comparison stage of a successive approximation analog-to-digital converter circuit, wherein the digitally controlled offset voltage has a periodic pattern including at least $2^{(K+1)}$ steps, each of which has a value equal to an integer multiplying $2^{(-K)}$ of an analog voltage corresponding to a least significant bit (LSB) of an N-bit digital signal, operating the successive approximation analog-to-digital converter circuit to sequentially generate at least a $2^{(K+1)}$ number of N-bit digital signals based on the at least $2^{(K+1)}$ steps of the digitally controlled offset voltage, summing the at least the $2^{(K+1)}$ number of N-bit digital signals to obtain a summing result, and dividing the summing result through a divider block to obtain a digital signal having (N+K) bits.

In accordance with another embodiment, a converter comprises a comparator configured to receive an output signal of a sample and hold block and an output of a digital-to-analog converter, an offset voltage generator configured to generate a digitally controlled offset voltage added into one input of the comparator, and wherein the digitally controlled offset voltage has a periodic pattern including at least $2^{(K+1)}$ steps, a successive approximation logic block configured to receive an output signal of the comparator, and generate at least a $2^{(K+1)}$ number of N-bit digital signals based on the at least $2^{(K+1)}$ steps of the digitally controlled offset voltage, a summing block configured to receive an output signal of the successive approximation logic block, and a divider block configured to receive a summing result generated by the summing block, wherein the converter is configured to generate a digital signal having (N+K) bits based on the digitally controlled offset voltage having the at least $2^{(K+1)}$ steps.

In accordance with yet another embodiment, a method comprises adding a digitally controlled offset voltage into a comparison stage of a successive approximation analog-to-digital converter circuit, wherein the digitally controlled offset voltage has a periodic pattern including at least $2^{(K+1)}-1$ steps, each of which has a value equal to an integer multiplying $2^{(-K)}$ of an analog voltage corresponding to an LSB (ALSB), wherein the digitally controlled offset voltage is in a ranging from $(2^{(-K)}-1)$ of the ALSB to $(1-2^{(-K)})$ of the ALSB, operating the successive approximation analog-to-digital converter circuit to sequentially generate at least a $2^{(K+1)}-1$ number of N-bit digital signals based on the at least $2^{(K+1)}-1$ steps of the digitally controlled offset voltage, calculating a weighted sum of the $2^{(K+1)}-1$ number of N-bit digital signals to obtain a weighted summing result, wherein an N-bit digital signal corresponding to an output signal of the successive approximation analog-to-digital converter circuit under a zero voltage offset is added twice into the weighted summing result, and dividing the weighted summing result through a divider block to obtain a digital signal having (N+K) bits.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a higher resolution successive approximation ADC. The present disclosure may also be applied, however, to a variety of systems and applications that convert an analog signal into a digital signal. Hereinafter, various embodiments will be explained in detail with reference to the accompanying drawings.

Figure 1:
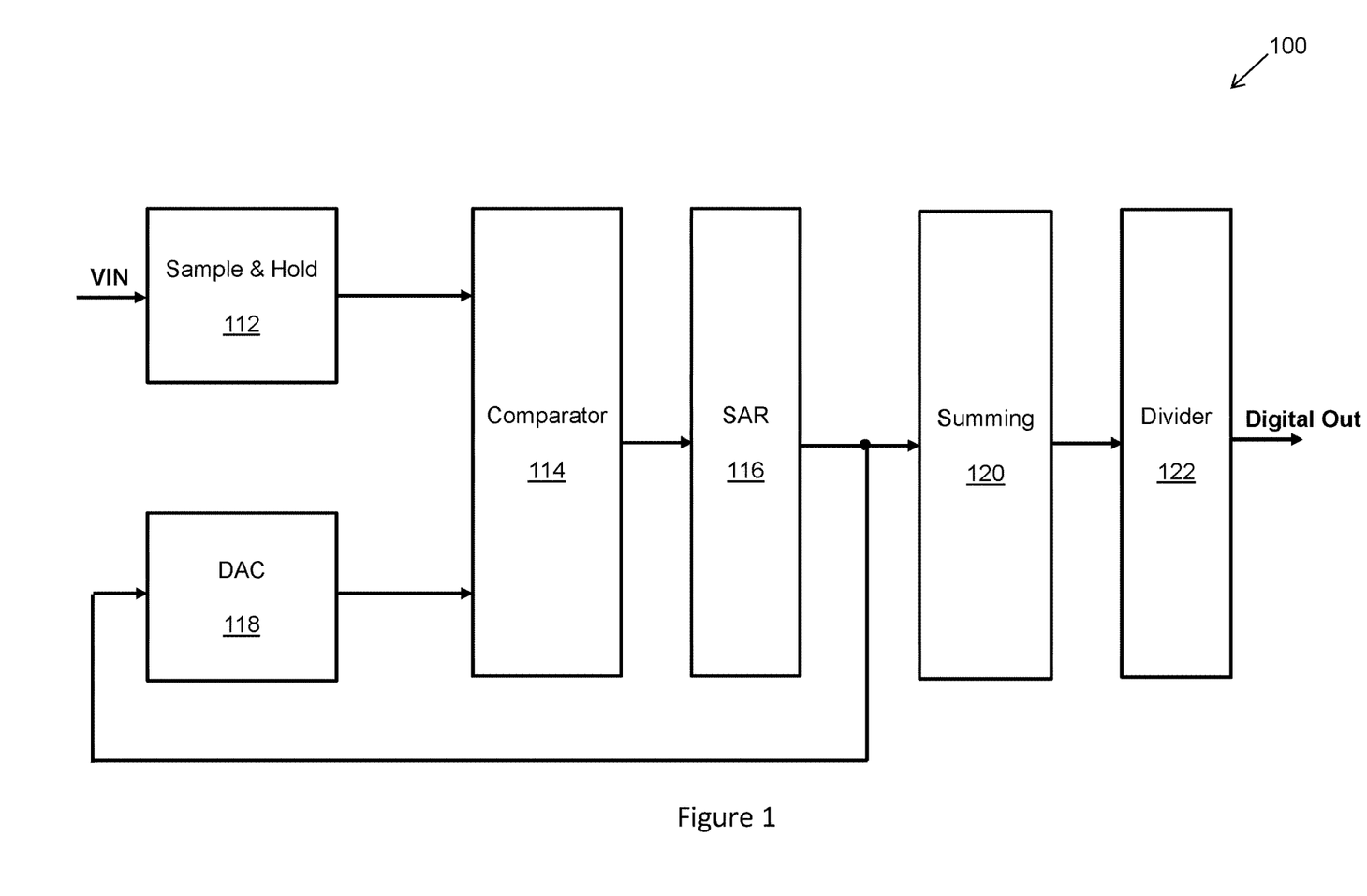
FIG. 1 illustrates a block diagram of a successive approximation ADC in accordance with various embodiments of the present disclosure.

FIG. 1 illustrates a block diagram of a successive approximation ADC in accordance with various embodiments of the present disclosure. The successive approximation ADC 100 comprises a sample and hold block 112, a comparator 114, a successive approximation logic block 116, a digital-to-analog converter (DAC) 118, a summing block 120 and a divider block 122. The successive approximation ADC 100 further comprises a digitally controlled offset voltage (not shown but illustrated in FIGS. 2-5). Depending on different design needs, the digitally controlled offset voltage may be added into the input voltage path (e.g., the successive approximation ADC 200 shown in FIG. 2). Alternatively, the digitally controlled offset voltage may be added into the ADC reference voltage path (e.g., the successive approximation ADC 300 shown in FIG. 3). Furthermore, the digitally controlled offset voltage may be added into the input voltage path through a voltage buffer (e.g., the successive approximation ADC 400 shown in FIG. 4).

In some embodiments, the successive approximation ADC 100 may be implemented as a 10-bit ADC. By employing the digitally controlled offset voltage, the successive approximation ADC 100 can be extended to a higher resolution ADC (e.g., an 11-bit ADC or a 12-bit ADC).

As shown in FIG. 1, the sample and hold block 112 is configured to receive an input signal VIN. VIN is an analog signal. The sample and hold block 112 may be configured to operate in either a sampling phase or a conversion phase. In the sampling phase, an internal switch is turned on. The input signal VIN may be sampled and stored at a holding circuit. In some embodiments, the sampled voltage may be stored on a capacitor, a capacitor network and the like. In the conversion phase, the internal switch may be turned off to hold the sampled voltage on the capacitor. This sampled voltage can then be provided to the comparator 114. Through a successive comparison process, the successive approximation ADC 100 generates a digital output corresponding to the input signal VIN.

As shown in FIG. 1, the output of the sample and hold block 112 is fed into a first input of the comparator 114. A second input of the comparator 114 is configured to receive an output signal generated by the DAC 118. The DAC 118 is employed to convert a digital output signal generated by the successive approximation logic block 116 into a corresponding analog signal. This analog signal is compared with the output signal of the sample and hold block 112 at the comparator 114. The comparison result generated by the comparator 114 is fed into the successive approximation logic block 116. Based on the comparison result, the successive approximation logic block 116 generates a digital output signal corresponding to the input signal VIN.

In operation, the successive approximation ADC 100 determines the value of each bit of the digital output signal in a sequential manner based on the output of the comparator 114. The successive approximation ADC 100 starts the conversion phase by temporally setting the most significant bit (MSB) of a digital word equal to 1, and all the other bits equal to 0. This digital word is applied to the DAC 118. In the DAC 118, an analog signal is generated based on the digital word.

This analog signal generated by the DAC 118 is compared to the input signal VIN. If the input signal VIN is greater than the analog signal generated by the DAC 118, the successive approximation logic block 116 sets the MSB of the digital word equal to 1. On the other hand, if the input signal VIN is less than the analog signal generated by the DAC 118, the successive approximation logic block 116 sets the MSB of the digital word equal to 0. After this comparison, the value of the MSB of the digital word has been determined.

The approximation process continues. In the next cycle, the second bit is temporally set to 1 and the remaining undetermined bits are set to 0. Once again, the output from the DAC 118 is compared to the input signal VIN. If the input signal VIN is greater than the analog signal generated by the DAC 118, the second bit is set to 1, otherwise to 0. After this comparison, the value of the second bit has been determined. The approximation process continues until the least significant bit (LSB) of the digital word has been determined. After the LSB of the digital word has been determined, one analog-to-digital conversion cycle is complete. The content of the digital word after the LSB has been determined represents the digital output of the successive approximation ADC 100.

In some embodiments, the successive approximation ADC 100 is configured to generate an N-bit digital signal. By employed a digitally controlled offset voltage having $2^{(K+1)}$ steps, the successive approximation ADC 100 is capable of generating an N+K bit digital signal to improve the resolution of the successive approximation ADC 100.

In operation, the digitally controlled offset voltage is added into the comparison stage of the successive approximation ADC 100. In some embodiments, the digitally controlled offset voltage has a periodic pattern. In each period, the digitally controlled offset voltage has $2^{(K+1)}$ steps. Each step has a value equal to an integer multiplying $2^{(-K)}$ of an analog voltage corresponding to the LSB of the N-bit digital signal. Throughout the description, the analog voltage corresponding to the LSB of the N-bit digital signal is alternatively referred to as ALSB. In each period, the digitally controlled offset voltage is in a range from $(2^{(-K)}-1)$ of ALSB to $(1-2^{(-K)})$ of ALSB. In each period, each step appears at least once, and the sum of the steps in one period is equal to zero.

The successive approximation analog-to-digital converter circuit (e.g., the successive approximation logic block 116) is configured to sequentially generate a $2^{(K+1)}$ number of N-bit digital signals based on the $2^{(K+1)}$ steps of the digitally controlled offset voltage. In the summing block 120, the $2^{(K+1)}$ number of N-bit digital signals are added together and fed into the divider block 122. In the divider block 122, the summing result generated by the summing block 120 is divided by 2 to obtain a digital signal having (N+K) bits. The detailed structure and operating principle of the digitally controlled offset voltage will be described below with respect to FIGS. 2-9.

Figure 2:
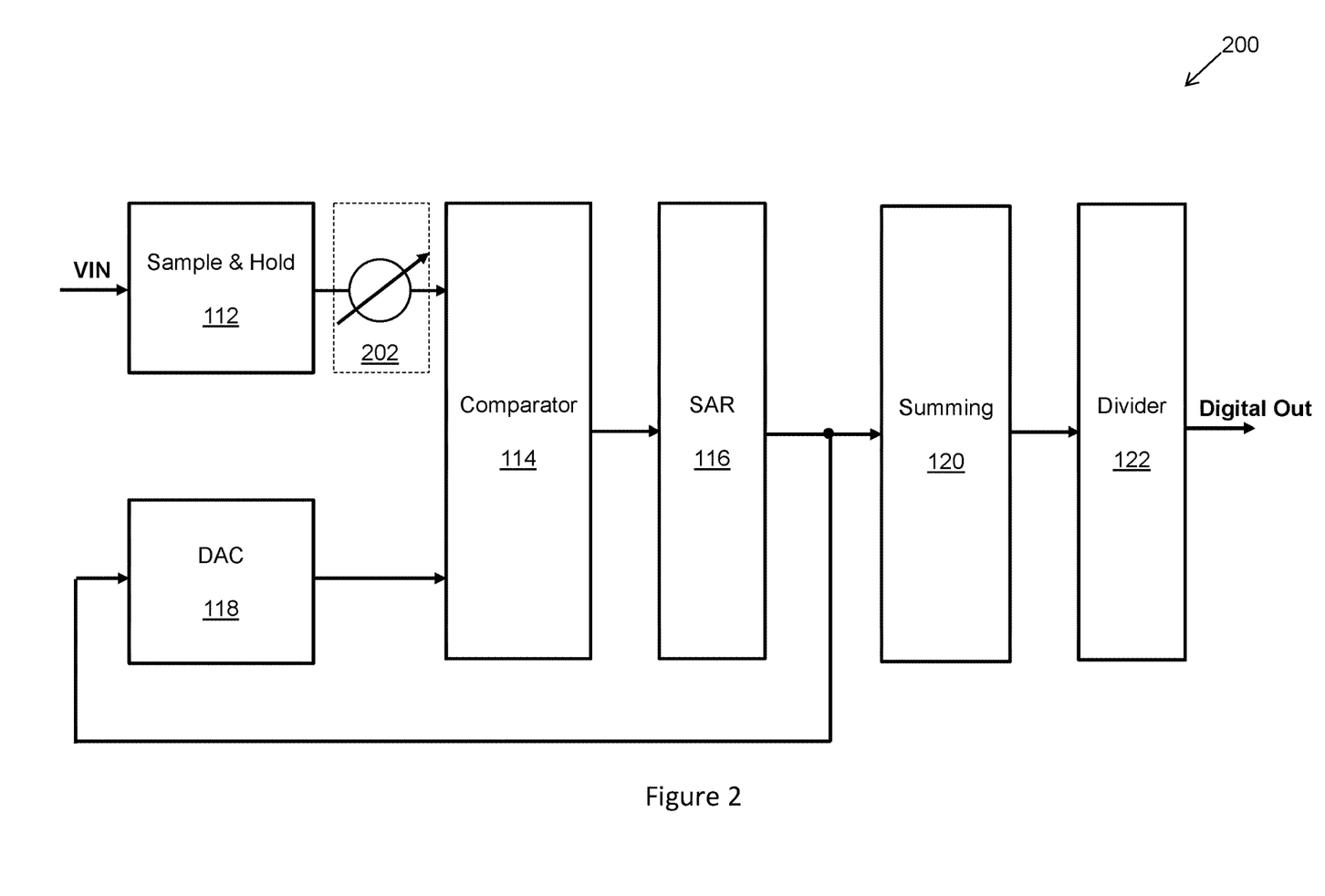
FIG. 2 illustrates a block diagram of a successive approximation ADC comprising a digitally controlled offset voltage added into the input voltage path in accordance with various embodiments of the present disclosure.

FIG. 2 illustrates a block diagram of a successive approximation ADC comprising a digitally controlled offset voltage added into the input voltage path in accordance with various embodiments of the present disclosure. A digitally controlled offset voltage 202 is added into the input voltage path of the successive approximation ADC 200. As shown in FIG. 2, the digitally controlled offset voltage 202 is placed between the output of the sample and hold block 112 and a first input of the comparator 114. The output voltage of the sample and hold block 112 and the digitally controlled offset voltage 202 are added together. The sum of the output voltage of the sample and hold block 112 and the digitally controlled offset voltage 202 is fed into the first input of the comparator 114.

In some embodiments, the digitally controlled offset voltage 202 has $2^{(K+1)}$ steps. Each step of the $2^{(K+1)}$ steps has a value equal to an integer multiplying $2^{(-K)}$ of the ALSB of an N-bit digital signal. The $2^{(K+1)}$ steps are added into the input voltage path. The successive approximation analog-to-digital converter circuit is configured to sequentially generate a $2^{(K+1)}$ number of N-bit digital signals based on the $2^{(K+1)}$ steps of the digitally controlled offset voltage 202. The $2^{(K+1)}$ number of N-bit digital signals are fed into the summing block 120. In the summing block 120, the $2^{(K+1)}$ number of N-bit digital signals is added together. The sum is fed into the divider block 122. In the divider block 122, the sum is divided by 2 to obtain a digital signal having (N+K) bits. The successive approximation analog-to-digital converter circuit repeats this analog-to-digital conversion process. The detailed process will be discussed below with respect to FIG. 6.

When K is equal to 1, the digitally controlled offset voltage 202 has 4 steps. The offsets of the digitally controlled offset voltage 202 are in a range from −ALSB/2 to ALSB/2. The offset of the first step is equal to 0. The offset of the second step is equal to ALSB/2. The offset of the third step is equal to 0. The offset of the fourth step is equal to −ALSB/2. When K is equal to 2, the digitally controlled offset voltage 202 has 8 steps. The offsets of the digitally controlled offset voltage 202 are in a range from −ALSB× 3/4 to ALSB×3/4. The offset of the first step is equal to 0. The offset of the second step is equal to ALSB/4. The offset of the third step is equal to ALSB×2/4. The offset of the fourth step is equal to ALSB×3/4. The offset of the fifth step is equal to 0. The offset of the sixth step is equal to −ALSB/4. The offset of the seventh step is equal to −ALSB× 2/4. The offset of the eighth step is equal to −ALSB×3/4. It should be noted that in both examples above, the sequence of the offset voltage steps is arbitrary. The sequence of the offset voltage steps may vary as long as in each period, each step appears at least once and the sum of the steps in one period is equal to zero.

An example below is used to further illustrate the operating principle of the successive approximation ADC 200 shown in FIG. 2. In some embodiments, K=1 and N=4. The digitally controlled offset voltage 202 has 4 steps. The successive approximation ADC 200 without the digitally controlled offset voltage 202 is capable of generating a 4-bit digital signal. By adding the digitally controlled offset voltage 202, the successive approximation ADC 200 is capable of generating a 5-bit digital signal.

The full range of the successive approximation ADC 200 is 1.6 V. The value of the ALSB is 0.1 V. The digitally controlled offset voltage 202 has 4 steps. Each step is equal to one half of the ALSB (one half of 0.1 V). There are four steps. In a first step, the product of zero and ALSB is added into the input voltage path. In other words, the offset voltage is equal to 0 V. In a second step, the product of 0.5 and ALSB is added into the input voltage path. In other words, the offset voltage is equal to 0.05 V. In a third step, the product of zero and ALSB is added into the input voltage path. In other words, the offset voltage is equal to 0 V. In a fourth step, the product of −0.5 and ALSB is added into the input voltage path. In other words, the offset voltage is equal to −0.05 V.

In some embodiments, the input voltage is equal to 0.87 V. The binary number of the ADC reference voltage is 1000. The corresponding analog voltage is 0.8 V. When the ADC process starts, the successive approximation analog-to-digital converter circuit generates four 4-bit binary numbers based on four different steps. In a first step, the input voltage is added with 0 V. The successive approximation analog-to-digital converter circuit generates 1000 (in binary form). The corresponding decimal value is equal to 8. In a second step, the input voltage is added with 0.05 V. The total voltage of 0.92 V is fed into the comparator. The successive approximation analog-to-digital converter circuit generates 1001 (in binary form). The corresponding decimal value is equal to 9. In a third step, the input voltage is added with 0 V. The successive approximation analog-to-digital converter circuit generates 1000 (in binary form). The corresponding decimal value is equal to 8. In a fourth step, the input voltage is added with −0.05 V. The total voltage of 0.82 V is fed into the comparator. The successive approximation analog-to-digital converter circuit generates 1000 (in binary form). The corresponding decimal value is equal to 8.

The digital signal results of these four steps are added together and then divided by 2. The decimal value of the final result is equal to 17. The decimal value corresponds to a 5-bit binary number. In this example, N is equal to 4 and K is equal to 1. K is used to set up the steps of the digitally controlled offset voltage 202. N is the existing resolution of the successive approximation ADC. By adding the digitally controlled offset voltage into the input voltage path and applying the summation and division algorithm described above, the resolution of the successive approximation ADC 200 has been increased by K bits.

Figure 3:
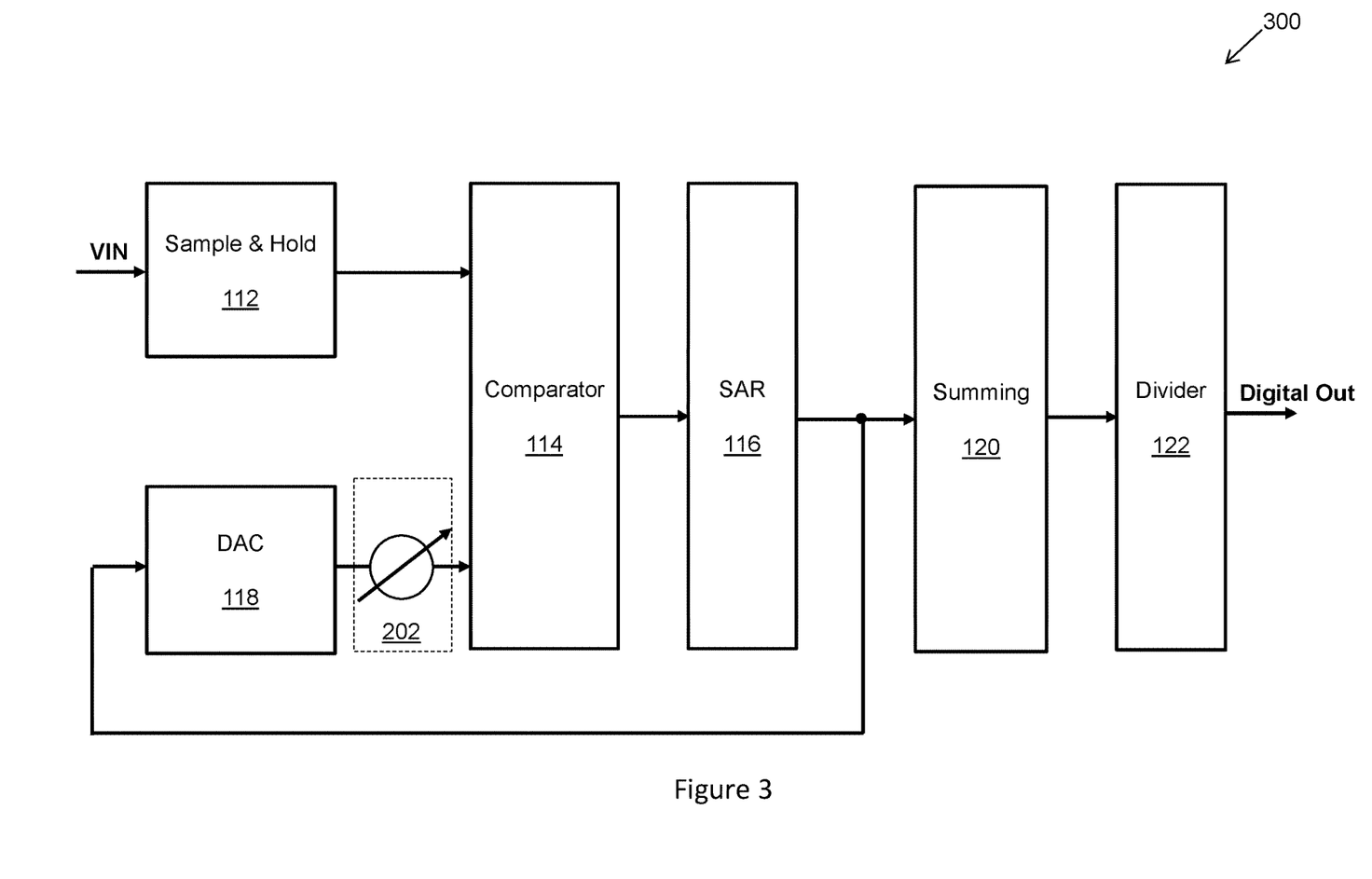
FIG. 3 illustrates a block diagram of a successive approximation ADC comprising a digitally controlled offset voltage added into the ADC reference voltage path in accordance with various embodiments of the present disclosure.

FIG. 3 illustrates a block diagram of a successive approximation ADC comprising a digitally controlled offset voltage added into the ADC reference voltage path in accordance with various embodiments of the present disclosure. The successive approximation ADC 300 shown in FIG. 3 is similar to the successive approximation ADC 200 shown in FIG. 2 except that the digitally controlled offset voltage 202 is added into the ADC reference voltage path. The operating principle of the successive approximation ADC 300 is similar to that discussed above with respect to FIG. 2, and hence is not discussed herein again.

Figure 4:
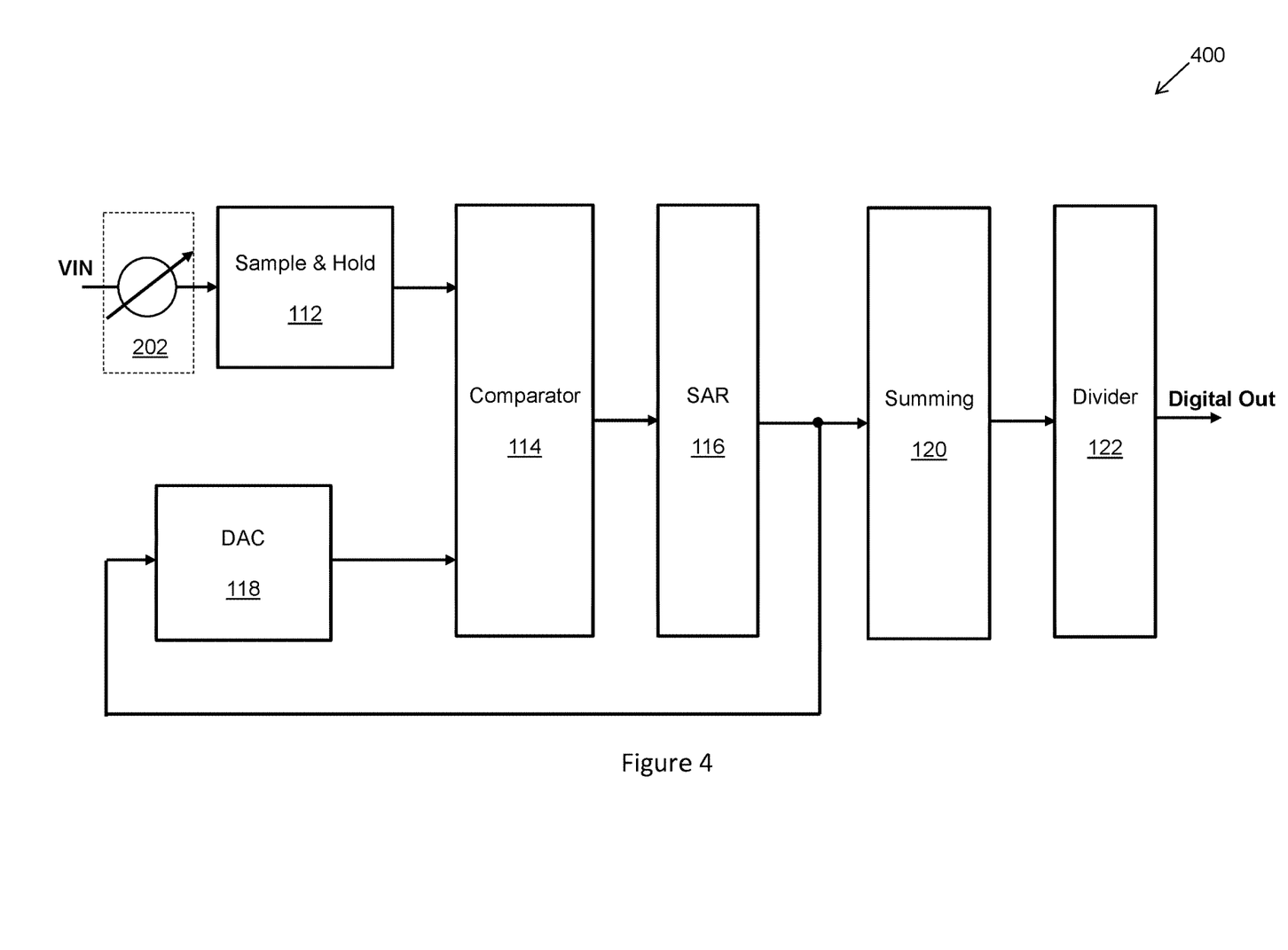
FIG. 4 illustrates a block diagram of a successive approximation ADC comprising a digitally controlled offset voltage added into the input voltage path through an input voltage buffer in accordance with various embodiments of the present disclosure.

FIG. 4 illustrates a block diagram of a successive approximation ADC comprising a digitally controlled offset voltage added into the input voltage path through an input buffer in accordance with various embodiments of the present disclosure. The successive approximation ADC 400 shown in FIG. 3 is similar to the successive approximation ADC 200 shown in FIG. 2 except that the digitally controlled offset voltage 202 is added into the input voltage path through an input voltage buffer (shown in FIG. 5). The operating principle of the successive approximation ADC 400 is similar to that discussed above with respect to FIG. 2, and hence is not discussed herein again.

Figure 5:
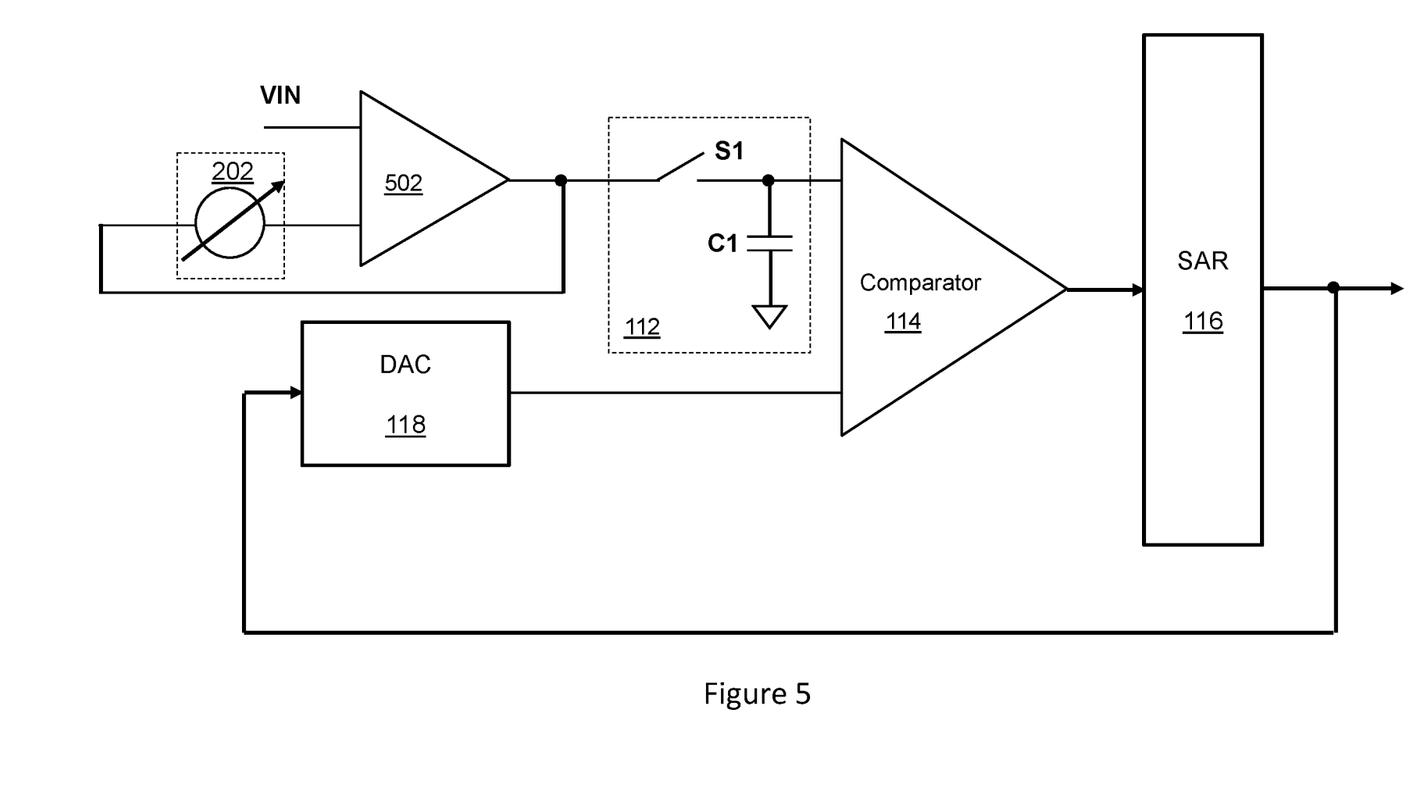
FIG. 5 illustrates a schematic diagram of the successive approximation ADC shown in FIG. 4 in accordance with various embodiments of the present disclosure.

FIG. 5 illustrates a schematic diagram of the successive approximation ADC shown in FIG. 4 in accordance with various embodiments of the present disclosure. The input voltage buffer may be implemented as a voltage follower shown in FIG. 5. Throughout the description, the input voltage buffer may be alternatively referred to as a voltage follower.

The voltage follower 502 is coupled to the sample and hold block 112. As shown in FIG. 5, the sample and hold block 112 comprises a switch S1 and a capacitor C1. The sample and hold circuit in the successive approximation ADC is well known in the art, hence is not discussed in detail for avoiding repetition.

The voltage follower 502 has a first input configured to receive the input voltage VIN and a second input connected to the output of the voltage follower 502 through the digitally controlled offset voltage 202. The output voltage of the voltage follower 502 is equal to the sum of the input voltage VIN and the digitally controlled offset voltage.

Figure 6:
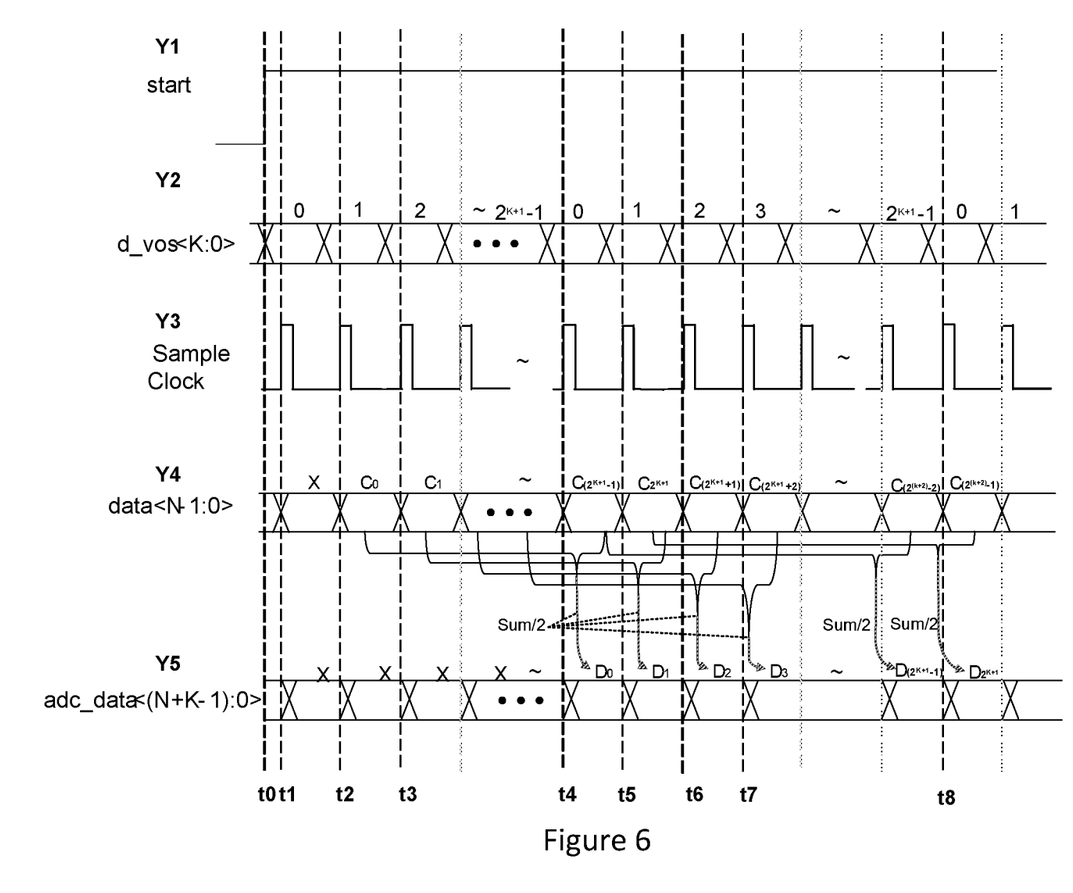
FIG. 6 illustrates a timing diagram of the successive approximation ADC shown in FIG. 2 in accordance with various embodiments of the present disclosure.

FIG. 6 illustrates a timing diagram of the successive approximation ADC shown in FIG. 2 in accordance with various embodiments of the present disclosure. The horizontal axis of FIG. 6 represents intervals of time. There are five vertical axes. The first vertical axis Y1 represents a start signal of the successive approximation ADC. The second vertical axis Y2 represents $2^{(K+1)}$ steps of the digitally controlled offset voltage (d_vos<K:0>). The third vertical axis Y3 represents the sampling clock. The fourth vertical axis Y4 represents the N-bit digital output signal (data<N−1:0>) of the successive approximation ADC. The fifth vertical axis Y5 represents (N+K)-bit digital output signal (adc_data<(N+K−1):0>) of the successive approximation ADC.

The digitally controlled offset voltage provides a periodic pattern. In each period, the digitally controlled offset voltage has $2^{(K+1)}$ steps. As shown in FIG. 6, a first period is from a first time instant t1 to a fourth time instant t4. The first period includes $2^{(K+1)}$ steps (from step 0 to step $2^{(K+1)}-1$) as shown in FIG. 6. The second period is from the fourth time instant t4 to an eighth time instant t8. The second period includes $2^{(K+1)}$ steps (from step 0 to step $2^{(K+1)}-1$) as shown in FIG. 6.

At the time instant t0, in response to the leading edge of the start signal, the analog-to-digital conversion starts. The first step of the digitally controlled offset voltage is added into the comparison stage of the successive approximation ADC (e.g., the first step is applied and stabilized, and ready to be added into the upcoming sampled analog voltage). After a suitable delay, at the first time instant t1, the sample and hold circuit obtains a sampled analog voltage from the input analog signal, and the first step of the digitally controlled offset voltage is added into the sampled signal. In response to this modified input voltage (the sum of the input voltage and the first step of the digitally controlled offset voltage), at a second time instant t2, the successive approximation ADC generates a first N-bit digital signal C0. Likewise, in the next analog-to-digital conversion cycle, the second step of the digitally controlled offset voltage is added into the comparison stage of the successive approximation ADC (e.g., the second step is added into the sampled analog voltage). In response to this modified input voltage (the sum of the input voltage and the second step of the digitally controlled offset voltage), at a third time instant t3, the successive approximation ADC generates a second N-bit digital signal C1. The successive approximation ADC repeats the analog-to-digital conversion by adding different steps of the digitally controlled offset voltage until at the fourth time instant t4, the successive approximation ADC generates the last N-bit digital signal $C(2^{(K+1)}-1)$.

After generating the N-bit digital signal $C(2^{(K+1)}-1)$, the summing block of the successive approximation ADC sums the $2^{(K+1)}$ number of N-bit digital signals (C0, C1, . . . , $C(2^{(K+1)}-1)$) together. The divider block of the successive approximation ADC divides the sum of the $2^{(K+1)}$ number of N-bit digital signals by 2 to generate a first (N+K)-bit digital signal D0 as shown in FIG. 6.

In the subsequent analog-to-digital conversion cycles, the successive approximation ADC repeats the same analog-to-digital conversion process. In particular, from the fourth time instant t4 to the eighth time instant t8, $2^{(K+1)}$ steps of the second period of the digitally controlled offset voltage are added into the comparison stage of the successive approximation ADC. The successive approximation ADC sequentially generates a $2^{(K+1)}$ number of N-bit digital signals ($C(2^{(K+1)})$, $C(2^{(K+1)}+1)$, . . . , $C(2^{(K+2)}-2)$ and $C(2^{(K+2)}-1)$) as shown in FIG. 6.

As shown in FIG. 6, after generating the N-bit digital signal $C(2^{(K+1)})$, the summing block of the successive approximation ADC sums the $2^{(K+1)}$ number of N-bit digital signals (C1, . . . , C($2^{(K+1)}$) together. The divider block of the successive approximation ADC divides the sum of the $2^{(K+1)}$ number of N-bit digital signals by 2 to generate a second (N+K)-bit digital signal D1 at the fifth time instant t5 as shown in FIG. 6.

Likewise, after generating the N-bit digital signal C($2^{(K+1)}$+1), the summing block of the successive approximation ADC sums the $2^{(K+1)}$ number of N-bit digital signals (C2, . . . , C($2^{(K+1)}$+1) together. The divider block of the successive approximation ADC divides the sum of the $2^{(K+1)}$ number of N-bit digital signals by 2 to generate a third (N+K)-bit digital signal D2 at the sixth time instant t6 as shown in FIG. 6.

Furthermore, after generating the N-bit digital signal C($2^{(K+1)}$+2), the summing block of the successive approximation ADC sums the $2^{(K+1)}$ number of N-bit digital signals (C3, . . . , C($2^{(K+1)}$+2) together. The divider block of the successive approximation ADC divides the sum of the $2^{(K+1)}$ number of N-bit digital signals by 2 to generate a fourth (N+K)-bit digital signal D3 at the sixth time instant t7 as shown in FIG. 6.

The successive approximation ADC repeats this analog-to-digital conversion process. At the eighth time instant t8, the summing block of the successive approximation ADC sums the $2^{(K+1)}$ number of N-bit digital signals (C($2^{(K+1)}$), . . . , C($2^{(K+2)}$−1)) together. The divider block of the successive approximation ADC divides the sum of the $2^{(K+1)}$ number of N-bit digital signals by 2 to generate a (N+K)-bit digital signal D($2^{(K+1)}$).

It should be noted the signals labelled with X shown in FIG. 6 are unknown signals. The unknown signals should be ignored during the analog-to-digital conversion process. As shown in FIG. 6, without having the digitally controlled offset voltage and the associated higher resolution ADC, C0 is the first digital output signal of the successive approximation ADC. After having the digitally controlled offset voltage and the associated higher resolution ADC, D0 is the first digital output signal of the successive approximation ADC. From t2 to t4, there are ($2^{(-K)}$−1) analog-to-digital conversion cycles. In other words, the higher resolution ADC only brings a delay equal to ($2^{(-K)}$−1) analog-to-digital conversion cycles.

Figure 7:
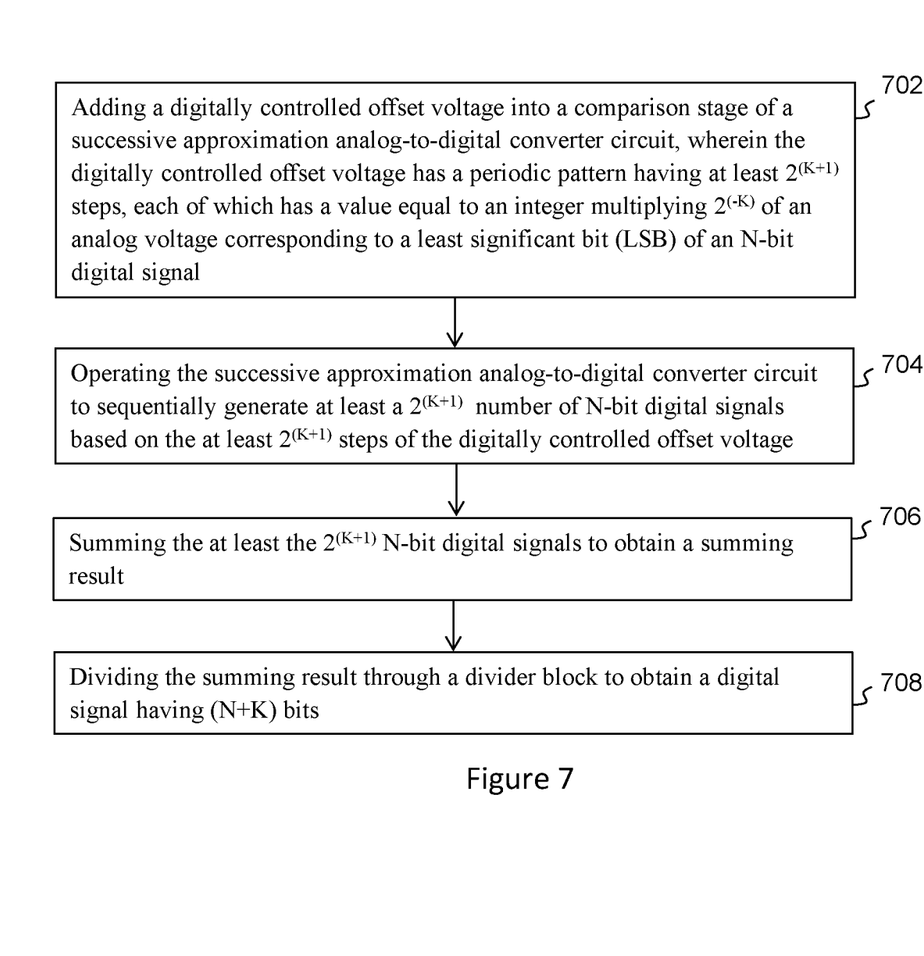
FIG. 7 illustrates a flow chart of a method for achieving a higher resolution ADC in accordance with various embodiments of the present disclosure.

FIG. 7 illustrates a flow chart of a method for achieving a higher resolution ADC in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

At step 702, a digitally controlled offset voltage is added into a comparison stage of a successive approximation analog-to-digital converter circuit. The digitally controlled offset voltage has a periodic pattern including at least $2^{(K+1)}$ steps. Each step has a value equal to an integer multiplying $2^{(-K)}$ of an analog signal corresponding to a least significant bit (LSB) of an N-bit digital signal.

At step 704, the successive approximation analog-to-digital converter circuit is configured to sequentially generate a $2^{(K+1)}$ number of N-bit digital signals based on the at least the $2^{(K+1)}$ steps of the digitally controlled offset voltage.

At step 706, the $2^{(K+1)}$ number of N-bit digital signals is added together in a summing block to obtain a summing result.

At step 708, the summing result generated by the summing block is divided through a divider block to obtain a digital signal having (N+K) bits.

In each period of the digitally controlled offset voltage, each step appears at least once, and the sum of the steps in one period is equal to zero. In the divider block, the summing result is divided by 2 to obtain the digital signal having (N+K) bits.

The method further comprises placing the digitally controlled offset voltage between an output of a sample and hold block and a first input of the comparison stage, wherein an output voltage of the sample and hold block and the digitally controlled offset voltage are added together, and a sum of the output voltage of the sample and hold block and the digitally controlled offset voltage is fed into the first input of the comparison stage.

The method further comprises placing the digitally controlled offset voltage between an output of a digital-to-analog converter circuit and a second input of the comparison stage, wherein an output voltage of the digital-to-analog converter circuit and the digitally controlled offset voltage are added together, and a sum of the output voltage of the digital-to-analog converter circuit and the digitally controlled offset voltage is fed into the second input of the comparison stage.

The method further comprises placing the digitally controlled offset voltage at an input of a sample and hold block, wherein the digitally controlled offset voltage and an output voltage of the sample and hold block are added together, and a sum of the output voltage of the sample and hold block and the digitally controlled offset voltage is fed into a first input of the comparison stage.

The digitally controlled offset voltage is coupled to the sample and hold block through an input voltage buffer. The input voltage buffer is a voltage follower. The voltage follower has a first input configured to receive the analog input signal, and a second input connected to an output of the voltage follower through the digitally controlled offset voltage, and wherein an output voltage of the voltage follower is equal to a sum of the analog input signal and the digitally controlled offset voltage.

The digital signal having (N+K) bits is generated after a delay equal to ($2^{(K+1)}$−1) analog-to-digital conversion cycles.

In some embodiments, the digitally controlled offset voltage pattern can be further simplified to have only $2^{(K+1)}$−1 steps. The $2^{(K+1)}$−1 steps can enable the successive approximation ADC 100 to generate an (N+K) bit digital signal to improve the resolution of the successive approximation ADC 100.

Similarly, in operation, the digitally controlled offset voltage is added into the comparison stage of the successive approximation ADC 100. In some embodiments, the digitally controlled offset voltage has a periodic pattern. In each period, the digitally controlled offset voltage has ($2^{(K+1)}$−1) steps. Each step has a value equal to an integer multiplying $2^{(-K)}$ of the ALSB. The values of the steps are in a range from ($2^{(-K)}$−1) of the ALSB to (1−$2^{(-K)}$) of the ALSB. In each period, each step appears at least once and the sum of the steps in one period is equal to zero. More specifically, the digitally controlled offset voltage steps comprise the following $2^{(K+1)}$−1 values: $\{(2^{(-K)}-1), (2 \cdot 2^{(-K)}-1), (3 \cdot 2^{(-K)}-1), \ldots, ((2^{(K)}-1) \cdot 2^{(-K)}-1), 0, (1-(2^{(K)}-1) \cdot 2^{(-K)}), \ldots, (1-3 \cdot 2^{(K)}), (1-2 \cdot 2^{(-K)}), (1-2^{(K)})\}$ with an arbitrary order.

The successive approximation analog-to-digital converter circuit is configured to sequentially generate a $2^{(-K)}$−1 number of N-bit digital signals based on the ($2^{(K+1)}$−1) steps of the digitally controlled offset voltage. The $(2^{(K+1)}-1)$ number of N-bit digital signals are fed into the summing block 120. In the summing block 120, the $(2^{(K+1)}-1)$ number of N-bit digital signals are added together. The voltage offset corresponding to 0 is added twice to the sum. The sum is then fed into the divider block 122. In the divider block 122, the sum is divided by 2 to obtain a digital signal having (N+K) bits. The successive approximation analog-to-digital converter circuit repeats this analog-to-digital conversion process. The detailed process will be discussed below with respect to FIG. 8.

In some embodiments, when K is equal to 1, the digitally controlled offset voltage 202 has 3 steps. The offsets of the digitally controlled offset voltage 202 have values of −ALSB/2, 0 and ALSB/2. The offset of the first step may be set to be 0. The offset of the second step may be set to be ALSB/2. The offset of the third step may be set to be −ALSB/2. When K is equal to 2, the digitally controlled offset voltage 202 has 7 steps. The offsets of the digitally controlled offset voltage 202 have values of −ALSB×3/4, −ALSB/2, −ALSB/4, 0, ALSB/4, ALSB/2 and ALSB×3/4. The offset of the first step may be set to be 0. The offset of the second step may be set to be ALSB/4. The offset of the third step may be set to be ALSB/2. The offset of the fourth step may be set to be ALSB×3/4. The offset of the fifth step may be set to be −ALSB/4. The offset of the sixth step may be set to be −ALSB/2. The offset of the seventh step may be set to be −ALSB×3/4. It should be noted that in both examples above, the sequence of the offset voltage steps is arbitrary, as long as in each period, each integer multiplying $2^{(-K)}$ of the ALSB appears once and the sum of the steps in one period is equal to zero. It should further be noted that an integer multiplying $2^{(-K)}$ of the ALSB has a value in a range from $(2^{(-K)}-1)$ to $(1-2^{(-K)})$ of the ALSB.

An example below is used to further illustrate the operating principle of the successive approximation ADC 200 shown in FIG. 2. In some embodiments, K=1 and N=4. The digitally controlled offset voltage 202 has 3 steps. The successive approximation ADC 200 without the digitally controlled offset voltage 202 is capable of generating a 4-bit digital signal. By adding the digitally controlled offset voltage 202, the successive approximation ADC 200 is capable of generating a 5-bit digital signal.

The full range of the successive approximation ADC 200 is 1.6 V. The value of the ALSB is 0.1 V. The digitally controlled offset voltage 202 has three steps. Each step is equal to one half of the ALSB (one half of 0.1 V). There are three steps. In a first step, the product of zero and ALSB is added into the input voltage path. In other words, the offset voltage is equal to 0 V. In a second step, the product of 0.5 and ALSB is added into the input voltage path. In other words, the offset voltage is equal to 0.05 V. In a third step, the product of −0.5 and ALSB is added into the input voltage path. In other words, the offset voltage is equal to −0.05 V.

In some embodiments, the input voltage is equal to 0.87 V. The binary number of the ADC reference voltage is 1000. The corresponding analog voltage is 0.8 V. When the ADC process starts, the successive approximation analog-to-digital converter circuit generates four 4-bit binary numbers based on three different steps. In a first step, the input voltage is added with 0 V. The successive approximation analog-to-digital converter circuit generates 1000 (in binary form). The corresponding decimal value is equal to 8. In a second step, the input voltage is added with 0.05 V. The total voltage of 0.92 V is fed into the comparator. The successive approximation analog-to-digital converter circuit generates 1001 (in binary form). The corresponding decimal value is equal to 9. In a third step, the input voltage is added with −0.05 V. The total voltage of 0.82 V is fed into the comparator. The successive approximation analog-to-digital converter circuit generates 1000 (in binary form). The corresponding decimal value is equal to 8.

The digital signal results of these three steps are added together with the digital signal result corresponding to 0V offset (the first step in this example) added twice to form a weighted sum, and then the weighted sum is divided by 2. The decimal value of the final result is rounded up to the nearest integer value. In the current example, the final result is 17, which corresponds to an analog voltage of 8.5V. The decimal value corresponds to a 5-bit binary number 10001. In this example, N is equal to 4 and K is equal to 1. K is used to set up the steps of the digitally controlled offset voltage 202. N defines the existing resolution of the successive approximation ADC. By adding the digitally controlled offset voltage into the input voltage path and applying the summation and division algorithm described above, the resolution of the successive approximation ADC 200 has been increased by K bits.

Figure 8:
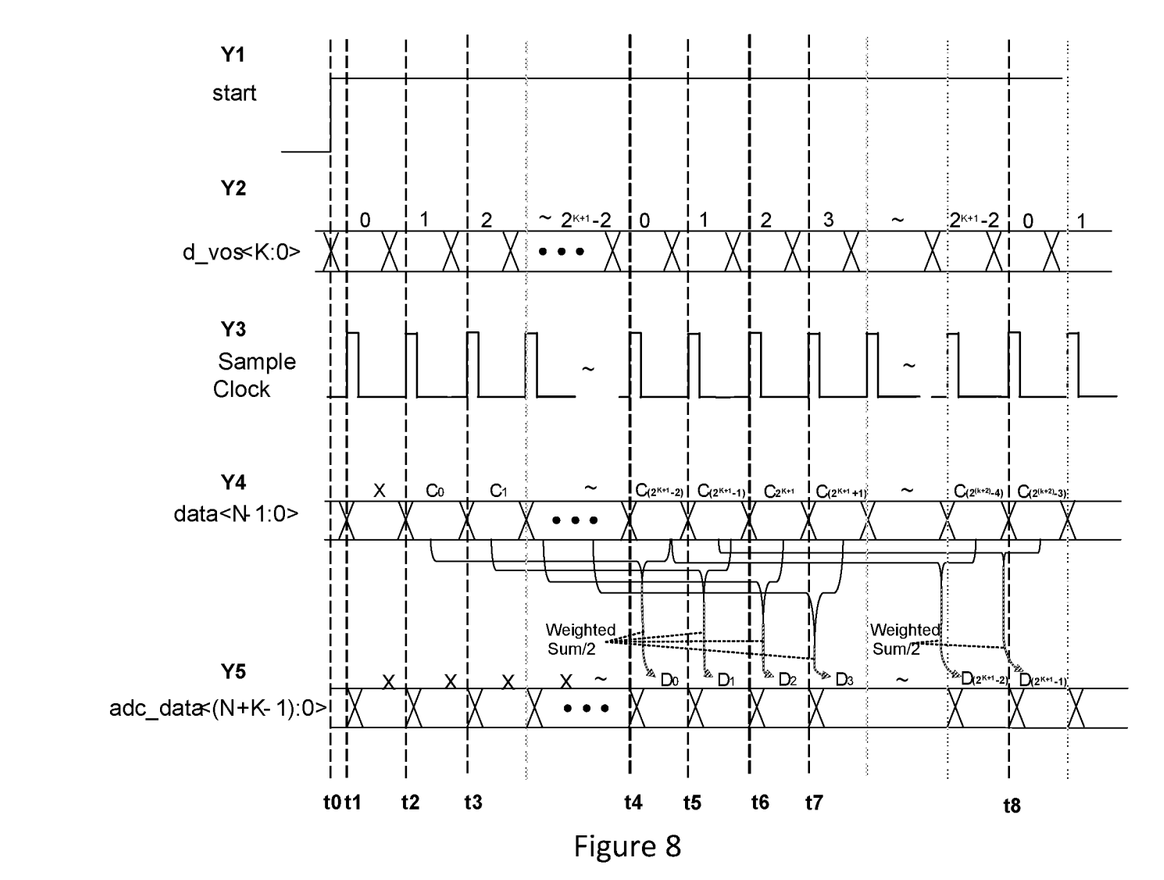
FIG. 8 illustrates another timing diagram of the successive approximation ADC shown in FIG. 2 in accordance with various embodiments of the present disclosure.

FIG. 8 illustrates another timing diagram of the successive approximation ADC shown in FIG. 2 in accordance with various embodiments of the present disclosure. The horizontal axis of FIG. 8 represents intervals of time. There are five vertical axes. The first vertical axis Y1 represents a start signal of the successive approximation ADC. The second vertical axis Y2 represents $2^{(K+1)}-1$ steps of the digitally controlled offset voltage (d_vos<K:0>). The third vertical axis Y3 represents the sampling clock. The fourth vertical axis Y4 represents the N-bit digital output signal (data<N−1:0>) of the successive approximation ADC. The fifth vertical axis Y5 represents (N+K)-bit digital output signal (adc_data<(N+K−1):0>) of the successive approximation ADC.

The digitally controlled offset voltage provides a periodic pattern. In each period, the digitally controlled offset voltage has $2^{(K+1)}-1$ steps. As shown in FIG. 8, a first period is from a first time instant t1 to a fourth time instant t4. The first period includes $(2^{(K+1)}-1)$ steps (from step 0 to step $(2^{(K+1)}-2)$) as shown in FIG. 8. The second period is from the fourth time instant t4 to an eighth time instant t8. The second period includes $(2^{(K+1)}-1)$ steps (from step 0 to step $(2^{(K+1)}-2)$) as shown in FIG. 8.

At the time instant t0, in response to the leading edge of the start signal, the analog-to-digital conversion starts. The first step of the digitally controlled offset voltage is added into the comparison stage of the successive approximation ADC (e.g., the first value is applied and stabilized, and ready to be added into the upcoming sampled analog voltage). After a suitable delay, at the first time instance t1, the sample and hold circuit obtains a sampled analog voltage from the input analog signal, then the first step of the digitally controlled offset voltage is added to the sampled signal. In response to this modified input voltage (the sum of the input voltage and the first step of the digitally controlled offset voltage), at a second time instant t2, the successive approximation ADC generates a first N-bit digital signal C0. Likewise, in the next analog-to-digital conversion cycle, the second step of the digitally controlled offset voltage is added into the comparison stage of the successive approximation ADC (e.g., the second step is added into the sampled analog voltage). In response to this modified input voltage (the sum of the input voltage and the second step of the digitally controlled offset voltage), at a third time instant t3, the successive approximation ADC generates a second N-bit digital signal C1. The successive approximation ADC repeats the analog-to-digital conversion by adding different steps of the digitally controlled offset voltage until at the fourth time instant t4, the successive approximation ADC generates the last N-bit digital signal $C(2^{(K+1)}-2)$.

After generating the N-bit digital signal $C(2^{(K+1)}-2)$, the $(2^{(K+1)}-1)$ number of N-bit digital signals (C0, C1, . . . , $C(2^{(K+1)}-2)$) are processed in the summing block of the successive approximation ADC, where $2^{(K+1)}$ numbers are summed. The $2^{(K+1)}$ numbers include C0, C1, . . . , $C(2^{(K+1)}-2)$ and an N-bit digital signal corresponding to an output signal of the successive approximation ADC when the digitally controlled offset voltage is 0. This N-bit digital signal could be anyone of $C0 \sim C(2^{(K+1)}-2)$ depending on the actual sequence of the offset steps. The divider block of the successive approximation ADC divides the sum of the $2^{(K+1)}$ number of the N-bit digital signals by 2 to generate a first (N+K)-bit digital signal D0 as shown in FIG. 8.

In the subsequent analog-to-digital conversion cycles, the successive approximation ADC repeats the same analog-to-digital conversion process. In particular, from the fourth time instant t4 to the eighth time instant t8, $(2^{(K+1)}-1)$ steps of the second period of the digitally controlled offset voltage are added into the comparison stage of the successive approximation ADC. The successive approximation ADC sequentially generates a $(2^{(K+1)}-1)$ number of N-bit digital signals ($C(2^{(K+1)}-1)$, $C(2^{(K+1)})$, $C(2^{(K+1)}+1)$, . . . , and $C(2^{(K+2)}-3)$) as shown in FIG. 8.

As shown in FIG. 8, after generating the N-bit digital signal $C(2^{(K+1)}-1)$, the summing block of the successive approximation ADC sums the $2^{(K+1)}$ number of N-bit digital signals including C1, $C(2^{(K+1)}-1)$ and an N-bit digital signal corresponding to the output signal of the successive approximation ADC when the digitally controlled offset voltage is 0. This N-bit digital signal could be anyone of $C1 \sim C(2^{(K+1)}-1)$ depending on the actual sequence of the voltage offset steps. The sum is then fed into the divider block of the successive approximation ADC where the sum of the $2^{(K+1)}$ number of N-bit digital signals is divided by 2 to generate a second (N+K)-bit digital signal D1 at the fifth time instant t5 as shown in FIG. 8.

Likewise, after generating the N-bit digital signal $C(2^{(K+1)})$, the summing block of the successive approximation ADC sums the $2^{(K+1)}$ number of N-bit digital signals including C2, . . . , $C(2^{(K+1)})$ and an N-bit digital signal corresponding to the output signal of the successive approximation ADC when the digitally controlled offset voltage is 0. The N-bit digital signal could be anyone of $C2 \sim C(2^{(K+1)})$ depending on the actual sequence of the offset steps. The sum is then fed into the divider block of the successive approximation ADC where the sum of the $2^{(K+1)}$ number of the N-bit digital signals is divided by 2 to generate a third (N+K)-bit digital signal D2 at the sixth time instant t6 as shown in FIG. 8.

Furthermore, after generating the N-bit digital signal $C(2^{(K+1)}+1)$, the summing block of the successive approximation ADC sums the $2^{(K+1)}$ number of N-bit digital signals including C3, . . . , $C(2^{(K+1)}+1)$ and an N-bit digital signal corresponding to the output signal of the successive approximation ADC when the digitally controlled offset voltage is 0. This N-bit digital signal could be anyone of $C3 \sim C(2^{(K+1)}+1)$ depending on the actual sequence of the voltage offset steps. The sum is then fed into the divider block of the successive approximation ADC where the sum of the $2^{(K+1)}$ number of the N-bit digital signals is divided by 2 to generate a fourth (N+K)-bit digital signal D3 at the sixth time instant t7 as shown in FIG. 8.

The successive approximation ADC repeats this analog-to-digital conversion process. At the eighth time instant t8, the summing block of the successive approximation ADC sums the $2^{(K+1)}$ number of N-bit digital signals including ($C(2^{(K+1)}-1)$, . . . , $C(2^{(K+2)}-3)$) and an N-bit digital signal corresponding to the output signal of the successive approximation ADC when the digitally controlled offset voltage is 0. The N-bit digital signal could be anyone of $C(2^{(K+1)}-1) \sim C(2^{(K+2)}-3)$ depending on the actual sequence of the voltage offset steps. The sum is then fed into the divider block of the successive approximation ADC where the sum of the $2^{(K+1)}$ number of the N-bit digital signals is divided by 2 to generate an (N+K)-bit digital signal $D(2^{(K+1)}-1)$ as shown in FIG. 8.

It should be noted the signals labelled with X shown in FIG. 8 are unknown signals. The unknown signals should be ignored during the analog-to-digital conversion process. As shown in FIG. 8, without having the digitally controlled offset voltage and the associated higher resolution ADC, C0 is the first digital output signal of the successive approximation ADC. After having the digitally controlled offset voltage and the associated higher resolution ADC, D0 is the first digital output signal of the successive approximation ADC. From t2 to t4, there are $(2^{(K+1)}-2)$ analog-to-digital conversion cycles. In other words, the higher resolution ADC only brings a delay equal to $(2^{(-K)}-2)$ analog-to-digital conversion cycles.

It should further be noted that while in FIG. 8, the operating principle of the successive approximation ADC is described based on the embodiment shown in FIG. 2, the embodiments illustrated in FIGS. 3-5 are applicable to the successive approximation ADC described above with respect to FIG. 8.

Figure 9:
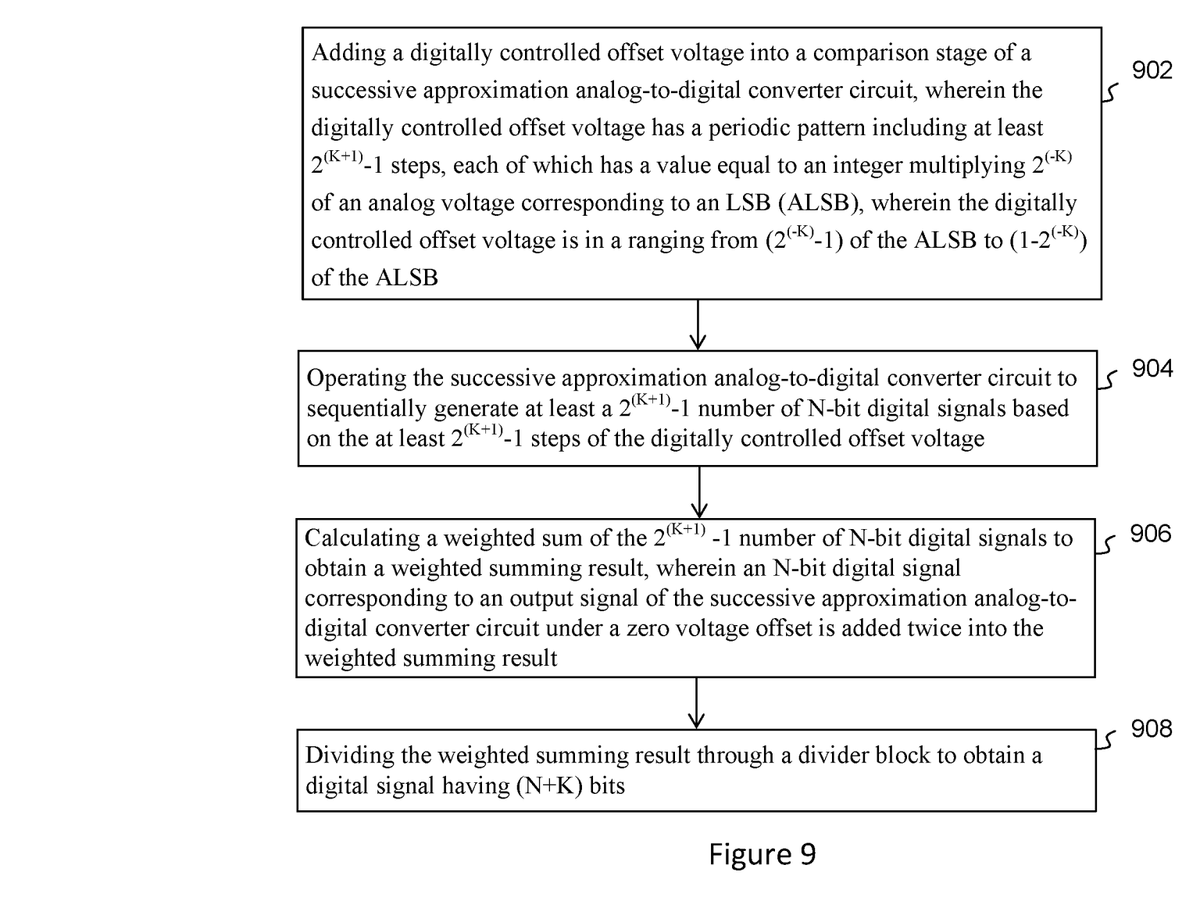
FIG. 9 illustrates a flow chart of another method for achieving a higher resolution ADC in accordance with various embodiments of the present disclosure.

FIG. 9 illustrates a flow chart of a method for achieving a higher resolution ADC in accordance with various embodiments of the present disclosure. This flowchart shown in FIG. 9 is merely an example, which should not unduly limit the scope of the claims. One of ordinary skill in the art would recognize many variations, alternatives, and modifications. For example, various steps illustrated in FIG. 9 may be added, removed, replaced, rearranged and repeated.

At step 902, a digitally controlled offset voltage is added into a comparison stage of a successive approximation analog-to-digital converter circuit. The digitally controlled offset voltage has a periodic pattern including at least $2^{(K+1)}-1$ steps. Each step has a value equal to an integer multiplying $2^{(-K)}$ of an ALSB ranging from $(2^{(-K)}-1)$ to $(1-2^{(-K)})$ of the ALSB.

At step 904, the successive approximation analog-to-digital converter circuit is configured to sequentially generate a $2^{(K+1)}-1$ number of N-bit digital signals based on the at least $2^{(K+1)}-1$ steps of the digitally controlled offset voltage.

At step 906, a weighted sum of the $2^{(K+1)}-1$ number of N-bit digital signals is calculated to obtain a weighted summing result, including the N-bit digital signal corresponding to the output signal of the successive approximation ADC when the digitally controlled offset voltage is 0. In other words, the output signal of the successive approximation ADC when the digitally controlled offset voltage is 0 is added twice in a summing block to obtain the weighted summing result.

At step 908, the weighted summing result generated by the summing block is divided through a divider block to obtain a digital signal having (N+K) bits.

In the divider block, the weighted summing result is divided by 2 to obtain the digital signal having (N+K) bits.

In each period of the digitally controlled offset voltage, each step appears at least once, and the sum of the steps in one period is equal to zero. The digital signal having (N+K) bits is generated after a delay equal to ($2^{(K+1)}-2$) analog-to-digital conversion cycles.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of converting an analog input signal to a digital output signal, comprising:
adding a digitally controlled offset voltage into a comparison stage of a successive approximation analog-to-digital converter circuit, wherein the digitally controlled offset voltage has a periodic pattern including at least $2^{(K+1)}$ steps, each of which has a value equal to an integer multiplying $2^{(-K)}$ of an analog voltage corresponding to a least significant bit (LSB) of an N-bit digital signal;
operating the successive approximation analog-to-digital converter circuit to sequentially generate at least a $2^{(K+1)}$ number of N-bit digital signals based on the at least $2^{(K+1)}$ steps of the digitally controlled offset voltage;
summing the at least the $2^{(K+1)}$ number of N-bit digital signals to obtain a summing result; and
dividing the summing result through a divider block to obtain a digital signal having (N+K) bits.

2. The method of claim 1, wherein:
in each period of the digitally controlled offset voltage, each step appears at least once, and the sum of the steps in one period is equal to zero.

3. The method of claim 1, wherein:
in the divider block, the summing result is divided by 2 to obtain the digital signal having (N+K) bits.

4. The method of claim 1, further comprising:
placing the digitally controlled offset voltage between an output of a sample and hold block and a first input of the comparison stage, wherein an output voltage of the sample and hold block and the digitally controlled offset voltage are added together, and a sum of the output voltage of the sample and hold block and the digitally controlled offset voltage is fed into the first input of the comparison stage.

5. The method of claim 1, further comprising:
placing the digitally controlled offset voltage between an output of a digital-to-analog converter circuit and a second input of the comparison stage, wherein an output voltage of the digital-to-analog converter circuit and the digitally controlled offset voltage are added together, and a sum of the output voltage of the digital-to-analog converter circuit and the digitally controlled offset voltage is fed into the second input of the comparison stage.

6. The method of claim 1, further comprising:
placing the digitally controlled offset voltage at an input of a sample and hold block, wherein the digitally controlled offset voltage and an output voltage of the sample and hold block are added together, and a sum of the output voltage of the sample and hold block and the digitally controlled offset voltage is fed into a first input of the comparison stage.

7. The method of claim 6, wherein:
the digitally controlled offset voltage is coupled to the sample and hold block through an input voltage buffer.

8. The method of claim 7, wherein the input voltage buffer is a voltage follower, and wherein:
the voltage follower has a first input configured to receive an analog input signal, and a second input connected to an output of the voltage follower through the digitally controlled offset voltage, and wherein an output voltage of the voltage follower is equal to a sum of the analog input signal and the digitally controlled offset voltage.

9. The method of claim 1, wherein:
the digital signal having (N+K) bits is generated after a delay equal to ($2^{(K+1)}-1$) analog-to-digital conversion cycles.

10. A converter comprising:
a comparator configured to receive an output signal of a sample and hold block and an output of a digital-to-analog converter;
an offset voltage generator configured to generate a digitally controlled offset voltage added into one input of the comparator, wherein the digitally controlled offset voltage has a periodic pattern including at least $2^{(K+1)}$ steps;
a successive approximation logic block configured to receive an output signal of the comparator, and generate at least a $2^{(K+1)}$ number of N-bit digital signals based on the at least $2^{(K+1)}$ steps of the digitally controlled offset voltage;
a summing block configured to receive an output signal of the successive approximation logic block; and
a divider block configured to receive a summing result generated by the summing block, wherein the converter is configured to generate a digital signal having (N+K) bits based on the digitally controlled offset voltage having the at least $2^{(K+1)}$ steps.

11. The converter of claim 10, wherein:
in each period of the digitally controlled offset voltage, each step appears at least once, and the sum of the steps in one period is equal to zero.

12. The converter of claim 10, wherein:
each of the at least $2^{(K+1)}$ steps has a value equal to an integer multiplying $2^{(-K)}$ of an analog voltage corresponding to a least significant bit (LSB) of an N-bit digital signal.

13. The converter of claim 10, wherein:
the successive approximation logic block is configured to generate a $2^{(K+1)}$ number of N-bit digital signals based on the at least $2^{(K+1)}$ steps of the digitally controlled offset voltage.

14. The converter of claim 13, wherein:
the summing block is configured to sum the $2^{(K+1)}$ number of N-bit digital signals to obtain the summing result; and the summing result generated by the summing block is divided by 2 to obtain the digital signal having (N+K) bits.

15. The converter of claim 10, wherein:
the digitally controlled offset voltage is placed between an output of the sample and hold block and a first input of the comparator, and wherein an output voltage of the sample and hold block and the digitally controlled offset voltage are added together, and a sum of the output voltage of the sample and hold block and the digitally controlled offset voltage is fed into a first input of the comparator.

16. The system of claim 15, wherein:
the digitally controlled offset voltage is added between an output of the digital-to-analog converter and a second input of the comparator.

17. The system of claim 15, wherein:
the digitally controlled offset voltage is added at an input of the sample and hold block through a voltage follower.

18. The system of claim 17, wherein:
the voltage follower has a first input configured to receive an analog input signal, and a second input connected to an output of the voltage follower through the digitally controlled offset voltage, and wherein an output voltage of the voltage follower is equal to a sum of the digitally controlled offset voltage and the analog input signal.

19. A method comprising:
adding a digitally controlled offset voltage into a comparison stage of a successive approximation analog-to-digital converter circuit, wherein the digitally controlled offset voltage has a periodic pattern including at least $2^{(K+1)}-1$ steps, each of which has a value equal to an integer multiplying $2^{(-K)}$ of an analog voltage corresponding to an LSB (ALSB), wherein the digitally controlled offset voltage is in a ranging from $(2^{(-K)}-1)$ of the ALSB to $(1-2^{(-K)})$ of the ALSB;

operating the successive approximation analog-to-digital converter circuit to sequentially generate at least a $2^{(K+1)}-1$ number of N-bit digital signals based on the at least $2^{(K+1)}-1$ steps of the digitally controlled offset voltage;

calculating a weighted sum of the $2^{(K+1)}-1$ number of N-bit digital signals to obtain a weighted summing result, wherein an N-bit digital signal corresponding to an output signal of the successive approximation analog-to-digital converter circuit under a zero voltage offset is added twice into the weighted summing result; and dividing the weighted summing result through a divider block to obtain a digital signal having (N+K) bits.

20. The method of claim 19, wherein:
in each period of the digitally controlled offset voltage, each step appears at least once, and the sum of the steps in one period is equal to zero; and
the digital signal having (N+K) bits is generated after a delay equal to $(2^{(K+1)}-2)$ analog-to-digital conversion cycles.

* * * * *